(12) United States Patent  
Haensch et al.

(10) Patent No.: US 7,989,900 B2  
(45) Date of Patent: Aug. 2, 2011

(54) SEMICONDUCTOR STRUCTURE INCLUDING GATE ELECTRODE HAVING LATERALLY VARIABLE WORK FUNCTION

(75) Inventors: Wilfried Haensch, Somers, NY (US); Steven Koester, Ossining, NY (US); Amlan Majumdat, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/544,452

(22) Filed: Aug. 20, 2009

(65) Prior Publication Data

US 2009/0309148 A1 Dec. 17, 2009

Related U.S. Application Data

(62) Division of application No. 11/677,207, filed on Feb. 21, 2007, now Pat. No. 7,781,288.

(51) Int. Cl.  
*H01L 29/78* (2006.01)

(52) U.S. Cl. ......... 257/407; 257/E21.196; 257/E29.152; 438/275

(58) Field of Classification Search .......... 257/407, 257/E29.152, E21.196, E21.444; 438/275  
See application file for complete search history.

(56) References Cited

U.S. PATENT DOCUMENTS

| | | | | |
|---|---|---|---|---|
| 5,175,119 A | * | 12/1992 | Matsutani | 438/290 |
| 5,210,435 A | | 5/1993 | Roth et al. | |
| 5,804,496 A | * | 9/1998 | Duane | 438/520 |
| 5,894,157 A | * | 4/1999 | Han et al. | 257/407 |
| 5,977,588 A | * | 11/1999 | Patel | 257/328 |
| 5,977,591 A | * | 11/1999 | Fratin et al. | 257/344 |
| 6,100,143 A | * | 8/2000 | Brown et al. | 438/296 |
| 6,255,175 B1 | * | 7/2001 | Yu | 438/289 |
| 6,281,559 B1 | | 8/2001 | Yu et al. | |
| 6,936,895 B2 | * | 8/2005 | Manna et al. | 257/288 |
| 7,195,969 B2 | | 3/2007 | Chan et al. | |
| 2005/0093032 A1 | * | 5/2005 | Liu et al. | 257/355 |
| 2005/0224886 A1 | * | 10/2005 | Doyle et al. | 257/368 |
| 2006/0244079 A1 | * | 11/2006 | Wang et al. | 257/407 |
| 2007/0037343 A1 | | 2/2007 | Colombo et al. | |

FOREIGN PATENT DOCUMENTS

JP 62-249486 A * 10/1987

OTHER PUBLICATIONS

Kedzierski et al., in "Metal-gate FinFET and fully-depleted SOI devices using total gate silicidation," IEDM Technical Digest, pp. 247-250, 2002.  
Krivokapic et al., in "Locally Strained Ultra-Thin Channel 25nm Narrow FDSOI Devices with Metal Gate and Mesa Isolation," IEDM Technical Digest, 2003.  
Kedzierski et al., in "Fabrication of Metal Gated FinFETs Through Complete Gate Silicidation With Ni," IEEE Transactions on Electron Devices, vol. 51, No. 12, pp. 2115-2120, 2004.  
Doris, et al., "High Performance FDSOI CMOS Technology with Metal Gate and High-K," 2005 Symposium on VLSI Technology Digest of Technical Papers, pp. 214-215, 2005.

* cited by examiner

*Primary Examiner* — Toniae M Thomas  
(74) *Attorney, Agent, or Firm* — Scully, Scott, Murphy & Presser, P.C.; Vazken Alexanian

(57) ABSTRACT

A semiconductor structure, such as a CMOS structure, includes a gate electrode that has a laterally variable work function. The gate electrode that has the laterally variable work function may be formed using an angled ion implantation method or a sequential layering method. The gate electrode that has the laterally variable work function provides enhanced electrical performance within an undoped channel field effect transistor device.

8 Claims, 10 Drawing Sheets

SEMICONDUCTOR STRUCTURE INCLUDING GATE ELECTRODE HAVING LATERALLY VARIABLE WORK FUNCTION

RELATED APPLICATIONS

This application is a divisional of U.S. application Ser. No. 11/677,207, filed Feb. 21, 2007.

BACKGROUND

1. Field of the Invention

The invention relates generally to semiconductor structures that may include metal oxide semiconductor field effect transistor (MOSFET) devices. More particularly, the invention relates to semiconductor structures with enhanced performance.

2. Description of the Related Art

As MOSFET device dimensions decrease, and in particular as MOSFET gate electrode dimensions decrease, several novel effects become more prominent within MOSFET devices. Particularly detrimental novel effects are short channel effects. Short channel effects result from an inadequate level of electrical control of a gate electrode over a channel region within a MOSFET. Undesirable results of short channel effects include high MOSFET off-state currents, high standby power consumptions, and detrimental electrical parameter variations within MOSFET devices.

In an effort to minimize short channel effects and reduce variation of threshold voltage, MOSFET devices have recently been fabricated with undoped and extremely thin body regions, including undoped and extremely thin channel regions. However, while these undoped body regions provide MOSFET devices with enhanced short channel effect control, undoped body regions may in fact provide for compromise of other electrical parameters of MOSFET devices.

Various semiconductor structures having enhanced performance, and methods for fabrication thereof, are known in the semiconductor fabrication art.

Specific examples of such semiconductor structures are disclosed by: (1) Kedzierski et al., in "Metal-gate FinFET and fully-depleted SOI devices using total gate silicidation," IEDM Technical Digest, pp. 247-50, 2002 (metal gate FinFET and fully depleted SOI devices with enhanced electrical performance); (2) Krivokapic et al., in "Locally Strained Ultra-Thin Channel 25 nm Narrow FDSOI Devices with Metal Gate and Mesa Isolation," IEDM Technical Digest, 2003 (NMOS & PMOS devices fabricated within a semiconductor on insulator (SOI) substrate for enhanced performance); (3) Kedzierski et al., in "Fabrication of Metal Gated FinFETs Through Complete Gate Silicidation With Ni," IEEE Transactions on Electron Devices, vol. 51, no. 12, pp. 2115-20, 2004 (metal gate FinFETs fabricated with enhanced workfunction control); and (4) Doris et al., in "High Performance FDSOI CMOS Technology with Metal Gate and High-K," 2005 Symposium on VLSI Technology Digest of Technical Papers, pp. 214-15, 2005 (CMOS devices with workfunction tuning for enhanced performance).

Semiconductor structure performance requirements are certain to increase as semiconductor structure and device dimensions decrease. Thus, desirable are semiconductor structures, and methods for fabrication thereof, that provide enhanced performance at decreased dimensions.

SUMMARY

The invention includes a semiconductor structure and related methods for fabricating the semiconductor structure.

The semiconductor structure includes a gate electrode designed to include a laterally variable work function. The gate electrode may be used within MOSFET, CMOS and finFET devices. The methods are directed towards fabricating the gate electrode that includes the laterally variable work function. Within the context of the invention as disclosed and claimed, a "laterally variable work function" is intended as a variation of work function of a gate electrode as a function of linewidth (i.e., alternatively referred to as gate length) of the gate electrode. Such a gate electrode that includes the laterally variable work function may also have a vertically variable work function.

While not wishing to be bound to a particular theory of operation of a semiconductor structure in accordance with the invention, a threshold voltage of an n-FET or a p-FET may increase on increasing or decreasing a gate electrode work function thereof. If the n-FET or the p-FET has a higher or lower work function gate electrode on the edge compared to the center, then an effective work function would increase or decrease at smaller gate lengths of the gate electrode. Therefore, the n-FET or p-FET threshold voltage would increase at smaller gate lengths before short-channel effects overwhelm the above-mentioned work function related effect, thus leading to a peak in threshold voltage vs gate length characteristics, similar to that which is realized in conventional FETs by using halo doping.

A semiconductor structure in accordance with the invention includes a gate electrode located over a semiconductor substrate. Within the semiconductor structure, the gate electrode has a laterally variable work function.

A particular method in accordance with the invention includes providing a semiconductor substrate including a gate electrode formed over the semiconductor substrate. This particular method also includes processing the gate electrode to provide a processed gate electrode having a laterally variable work function.

Another particular method in accordance with the invention includes providing a semiconductor substrate including a dummy gate electrode formed within a dielectric layer over the semiconductor substrate. This particular method also includes removing the dummy gate electrode to form an aperture. This particular method also includes forming sequentially within the aperture a work function modifying layer and then a gate electrode.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENTS

The invention, which includes a semiconductor structure that in turn includes a gate electrode having a laterally variable work function (and methods for fabrication thereof), is described in greater detail below within the context of the drawings described above. Since the drawings are intended for illustrative purposes, the drawings are not necessarily drawn to scale.

Figure 1:
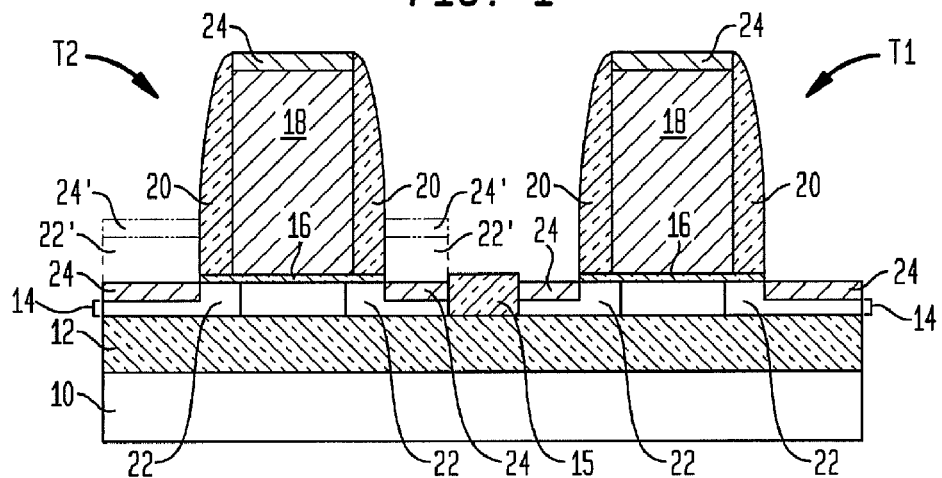
FIG. 1 to FIG. 6 show a series of schematic cross-sectional diagrams illustrating the results of progressive stages in fabricating a semiconductor structure in accordance with an embodiment of the invention.

FIG. 1 to FIG. 6 show a series of schematic cross-sectional diagrams illustrating the results of progressive stages in fabricating a semiconductor structure in accordance with an embodiment of the invention. This particular embodiment of the invention comprises a first embodiment of the invention. FIG. 1 shows a schematic cross-sectional diagram of the semiconductor structure at an early stage in fabrication thereof in accordance with the first embodiment.

FIG. 1 shows a base semiconductor substrate 10. A buried dielectric layer 12 is located upon the base semiconductor substrate 10 and a surface semiconductor layer 14 is located upon the buried dielectric layer 12. Portions of the surface semiconductor layer 14 are separated by an isolation region 15. In an aggregate, the base semiconductor substrate 10, the buried dielectric layer 12 and the surface semiconductor layer 14 comprise a semiconductor-on-insulator substrate.

The base semiconductor substrate 10 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a thickness from about 0.5 to about 1.5 millimeters.

The buried dielectric layer 12 may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material. The buried dielectric layer 12 may be formed using any of several methods. Non-limiting examples include ion implantation methods, thermal or plasma oxidation or nitridation methods, chemical vapor deposition methods and physical vapor deposition methods. The buried dielectric layer 12 may also be formed using a wafer bonding or lamination technique. Typically, the buried dielectric layer 12 comprises an oxide of the semiconductor material from which is comprised the base semiconductor substrate 10. Typically, the buried dielectric layer 12 has a thickness from about 50 to about 20000 angstroms.

The surface semiconductor layer 14 may comprise any of the several semiconductor materials from which the base semiconductor substrate 10 may be comprised. The surface semiconductor layer 14 and the base semiconductor substrate 10 may comprise either identical or different semiconductor materials with respect to chemical composition, dopant polarity, dopant concentration and crystallographic orientation. Typically, the surface semiconductor layer 14 may have a thickness from about 500 to about 1000 angstroms. However, within the context of the instant and following embodiments, the surface semiconductor layer 14 more preferably has a thickness from about 20 to about 200 angstroms.

The isolation region 15 may comprise any of several isolation materials that will typically comprise dielectric isolation materials. Typically, the isolation region 15 comprises a dielectric isolation material selected from the same group of dielectric isolation materials used for the buried dielectric layer 12. However a method for fabricating the isolation region 15 may be different from a method used for fabricating the buried dielectric layer 12. For example, and without limitation, an isolation dielectric material from which is comprised the isolation region 15 may be deposited using: (1) rapid thermal processing, for example high-temperature oxide also known as HTO; or (2) plasma deposition, for example high-density plasma oxide also known as HDP oxide; or (3) combinations of (1) and (2).

The semiconductor-on-insulator substrate portion of the semiconductor structure that is illustrated in FIG. 1 may be fabricated using any of several methods. Non-limiting examples include lamination methods, layer transfer methods and separation by implantation of oxygen (SIMOX) methods.

Although the instant embodiment illustrates the invention within the context of a semiconductor-on-insulator substrate comprising the base semiconductor substrate 10, the buried dielectric layer 12 and the surface semiconductor layer 14, neither the embodiments nor the invention is so limited. Rather, the embodiments may alternatively be practiced under certain circumstances using a bulk semiconductor substrate (that would otherwise result from absence of the buried dielectric layer 12 under circumstances where the base semiconductor substrate 10 and the surface semiconductor layer 14 have identical chemical composition and crystallographic orientation). The embodiments also contemplate use of a hybrid orientation (HOT) substrate. A hybrid orientation substrate has multiple crystallographic orientations within a single semiconductor substrate.

FIG. 1 also shows (in cross-section) a plurality of field effect transistor devices T1 and T2 located within and upon portions of the surface semiconductor layer 14 that are separated by the isolation region 15. The field effect transistor devices T1 and T2 comprise: (1) a plurality of gate dielectrics 16 located upon the surface semiconductor layer 14; (2) a plurality of gate electrodes 18 located upon the gate dielectrics 16; (3) a plurality of spacer layers 20 located adjoining opposite sidewalls of the gate dielectrics 16 and the gate electrodes 18 (although intended as completely encircling those structures in plan view); (5) a plurality of extension and source/drain regions 22 located within the surface semiconductor layer 14 and separated by preferably undoped channel regions beneath the gate electrodes 18; and (5) a plurality of silicide layers 24 located upon a plurality of top surfaces of the source/drain regions 22 and the gate electrodes 18.

Also illustrated in phantom within the schematic cross-sectional diagram of FIG. 1, are optional and preferred raised extension and source/drain regions 22' and silicide layers 24' that may be used in place of extension and source/drain regions 22 and silicide layers 24.

Each of the foregoing layers and structures may comprise materials and have dimensions that are conventional in the semiconductor fabrication art. Each of the foregoing layers and structures may also be formed using methods that are conventional in the semiconductor fabrication art.

The gate dielectrics 16 may comprise conventional dielectric materials such as oxides, nitrides and oxynitrides of silicon that have a dielectric constant from about 4 (i.e., typically a silicon oxide) to about 8, (i.e., typically a silicon nitride) measured in vacuum. Alternatively, the gate dielectrics 16 may comprise generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The gate dielectrics 16 may be formed using any of several methods that are appropriate to their material(s) of composition. Non limiting examples include thermal or plasma oxidation or nitridation methods, chemical vapor deposition methods (including atomic layer deposition methods) and physical vapor deposition methods. Typically, the gate dielectrics 16 comprise a thermal silicon oxide dielectric material that has a thickness from about 5 to about 70 angstroms.

The gate electrodes 18 may comprise materials including but not limited to certain metals, metal alloys, metal nitrides and metal silicides, as well as laminates thereof and composites thereof. The gate electrodes 18 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrodes 18 comprise a doped polysilicon material that has a thickness from about 400 to about 2000 angstroms. The gate electrodes 18 when formed of the doped polysilicon material are typically formed using lithographic and ion implantation methods. Ion implantation steps are needed to dope an NFET gate with n-type dopants and a PFET gate with p-type dopants.

The spacers 20 may comprise dielectric materials, and in particular the spacers may comprise generally lower dielectric constant dielectric materials that have a dielectric constant less than about 4. Such a low dielectric constant reduces parasitic capacitance between the gates 18 and the extension and source/drain regions 22. The spacer materials may be formed using methods including but not limited to chemical vapor deposition methods and physical vapor deposition methods. The spacers 20 are also formed with the distinctive inward pointing spacer shape by using a blanket layer deposition and anisotropic etchback method. Typically, the spacers 20 comprise a combination of silicon oxide and silicon nitride dielectric materials.

The extension and source/drain regions 22 comprise, as appropriate, a generally conventional n conductivity type dopant or a generally conventional p conductivity type dopant. As is understood by a person skilled in the art, the extension and source/drain regions 22 are formed using a two step ion implantation method. A first ion implantation process step within the method uses the gate electrodes 18, absent the spacers 20, as a mask to form a plurality of extension regions each of which extends beneath the spacers 20. A second ion implantation process step uses the gate electrodes 18 and the spacers 20 as a mask to form the larger contact region portions of the extension and source/drain regions 22, while simultaneously incorporating the extension regions. Dopant levels are from about 1e19 to about 1e21 dopant atoms per cubic centimeter within each of the extension and source/drain regions 22. Extension regions within the pair of extension and source/drain regions 22 may under certain circumstances be more lightly doped than contact regions with the pair of extension and source/drain regions 22, although such differential doping concentrations are not a requirement of the invention.

The silicide layers 24 may comprise any of several silicide forming metals. Non-limiting examples of candidate silicide forming metals include nickel, cobalt, titanium, tungsten, erbium, ytterbium, platinum and vanadium silicide forming metals, or alloys of the above materials. Nickel and cobalt silicide forming metals are particularly common. Others of the above enumerated silicide forming metals are less common. Typically, the silicide layers 24 are formed using a salicide method. The salicide method includes: (1) forming a blanket silicide forming metal layer upon the semiconductor structure of FIG. 1 absent the silicide layers 24; (2) thermally annealing the blanket silicide forming metal layer with silicon surfaces which it contacts to selectively form silicide layers while leaving unreacted metal silicide forming metal layers on, for example, the spacers 20; and (3) selectively stripping unreacted portions of the metal silicide forming metal layers from, for example, the spacers 20. Typically, the silicide layers 24 comprise a nickel silicide material or a cobalt silicide material that has a thickness from about 50 to about 300 angstroms.

Figure 2:
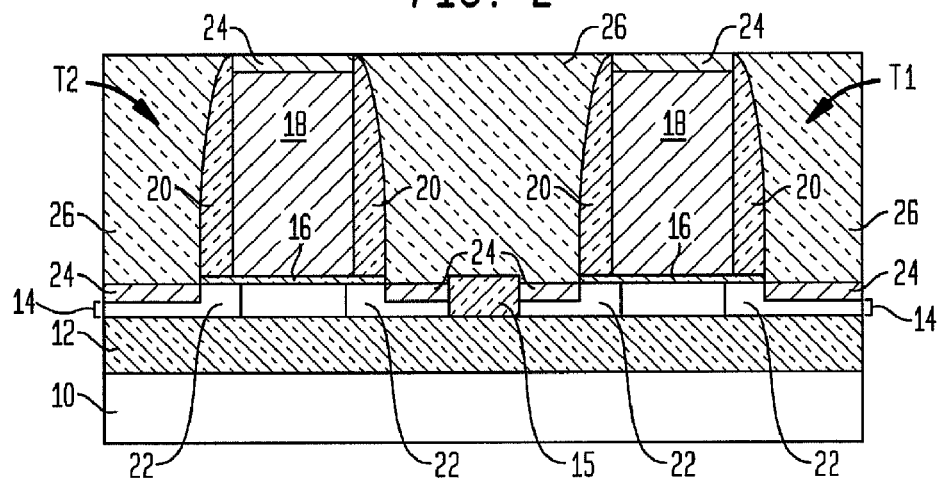

FIG. 2 shows an inter-level dielectric (ILD) layer 26 located to planarize the semiconductor structure that is illustrated in FIG. 1. The inter-level dielectric layer 26 may comprise any of the several dielectric materials from which is comprised the buried dielectric layer 12 and the isolation region 15. Alternatively, lower dielectric constant dielectric materials having a dielectric constant less than about 4 (i.e., fluorine doped and carbon doped silicon oxide materials) may also be used for the inter-level dielectric (ILD) layer 26 since they reduce parasitic capacitance between gate electrode 18 conductors. The inter-level dielectric layer 26 is typically deposited as a blanket layer and subsequently planarized to form the inter-level dielectric layer 26. Such planarization may be effected using methods that are conventional in the semiconductor fabrication art. Such planarization methods may include, but are not limited to mechanical planarizing methods, as well as chemical mechanical polish planarizing methods. Chemical mechanical polish planarizing methods are most common.

Figure 3:
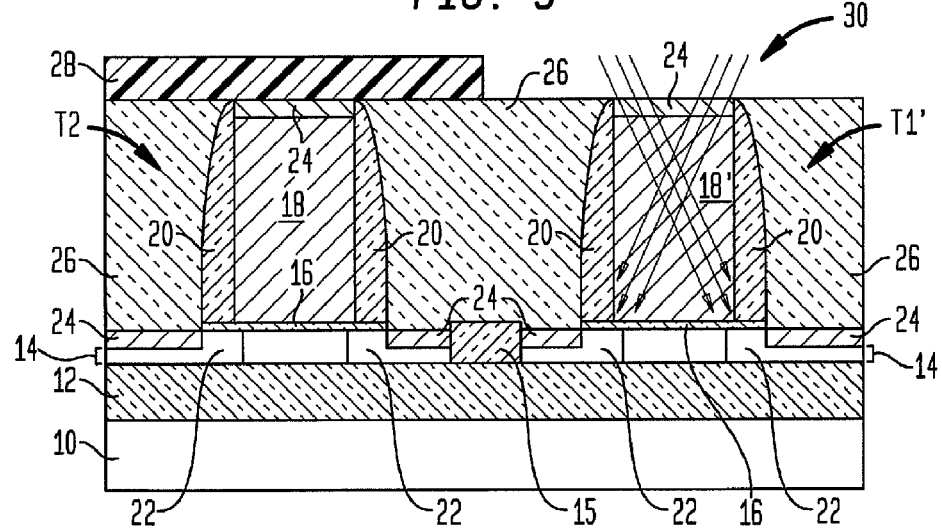

FIG. 3 first shows a mask layer 28 located covering the second transistor T2. The mask layer 28 may comprise any of several mask materials. Non-limiting examples include hard mask materials and photoresist mask materials. Photoresist mask materials are generally more common. Candidate photoresist materials include positive photoresist materials, negative photoresist materials and hybrid photoresist materials. Typically, the mask layer 28 comprises a positive photoresist material or a negative photoresist material that has a thickness from about 1000 to about 3000 angstroms.

FIG. 3 also shows a dose of first work function modifying ions 30 implanted into the gate electrode 18 of the first transistor T1 to form a first transistor T1' having a gate electrode 18'. The dose of first work function modifying ions 30 is implanted at a tilt angle from about 10 to about 45 degrees with respect to the plane of the base semiconductor substrate 10, so that a central inverted V shaped bottom portion of the gate electrode 18' is unimplanted by the dose of first work function modifying ions 30. When the gate electrodes 18 comprise a silicide material (such as but not limited to a nickel silicide material or a cobalt silicide material) or a doped polysilicon material, the dose of first work function modifying ions 30 may comprise a dopant, or more particularly a counter-dopant, that provides a lateral (i.e., a gate length or gate linewidth) dependent variation of work function within the gate electrode 18'. Typical dopants may include, but are not limited to, conventional arsenic, boron and phosphorus containing dopant species. Also included, and also not limiting are indium and antimony containing dopant species. Generally, any of group III (i.e., p type) and group V (i.e., n type) dopant species may be used. Typically, the dose of first work function modifying ions 30 is provided at a dose from about $10^{14}$ to about $10^{16}$ ions per square centimeter substrate area.

Figure 4:
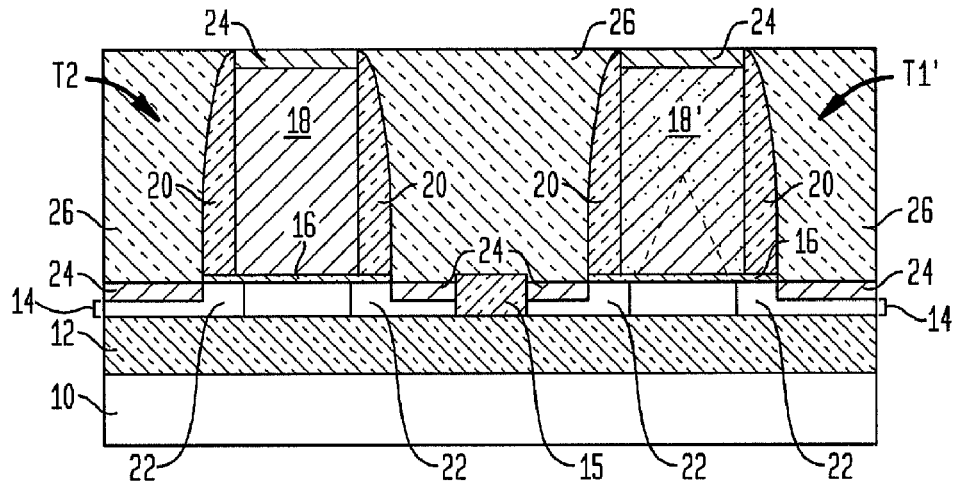

FIG. 4 shows the results of stripping the first mask 28 from the semiconductor structure of FIG. 3. The first mask may be stripped using methods and materials that are conventional in the semiconductor fabrication art. Non-limiting examples include wet chemical stripping methods and materials, dry plasma stripping methods and materials and aggregate stripping methods and materials thereof.

Figure 5:
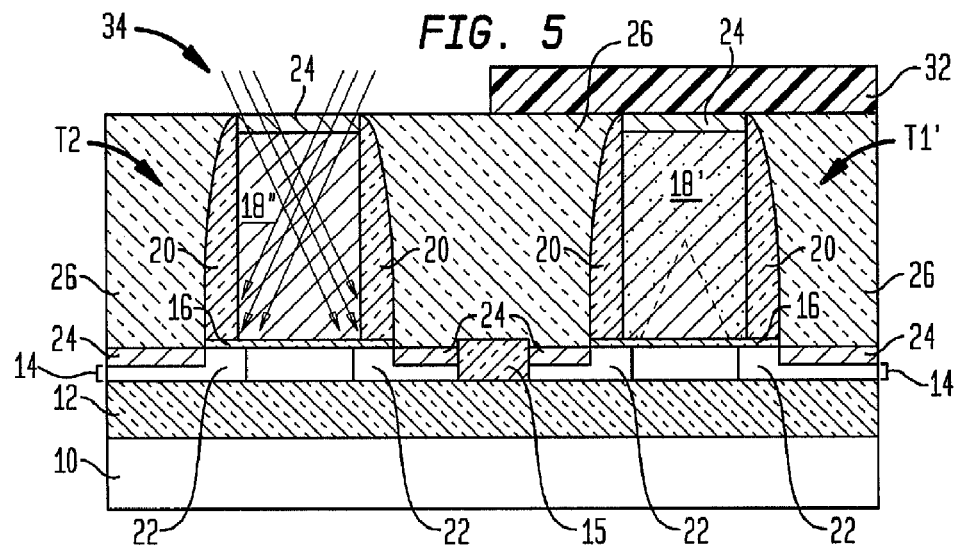

FIG. 5 shows a second mask 32 located covering the first transistor T1' and a dose of second work function modifying ions 34 implanted into the gate electrode 18 of the second transistor T2 to form a second transistor T2' having a gate electrode 18". The second mask 32 is otherwise analogous, equivalent or identical to the first mask 28, but the second mask is located covering the first transistor T1' rather than the second transistor T2. The dose of second work function modifying ions 34 is otherwise analogous, equivalent or identical to the dose of first work function modifying ions 30, but intended as having an opposite work function modifying effect in comparison with the dose of first work function modifying ions 30. More specifically, one of the dose of first work function modifying ions 30 and the dose of second work function modifying ions 34 is intended as providing a higher work function at the edges of a gate electrode 18' or 18" in comparison with a center of the gate electrode 18' or 18" (and is applicable to an n-FET). Similarly, the other of the dose of first work function modifying ions 30 and the dose of second work function modifying ions 34 is intended as providing a higher work function in a center of a gate electrode 18' or 18" in comparison with edges of the gate electrode 18' or 18" (and is applicable to a p-FET). Generally: (1) a work function in a center of the gate electrode 18' or 18" is from about 4.4 to about 4.6 electron-volts for nFETs and from about 4.6 to about 4.8 electron-volts for pFETs; (2) a lower work function for outer portions of the gate electrode 18' or 18" is from about 4.4 to about 4.6 electron-volts for p-FETs; and (3) a higher work function for outer portions of the gate electrode 18' or 18" is from about 4.6 to about 4.8 electron-volts for n-FETs.

Figure 6:
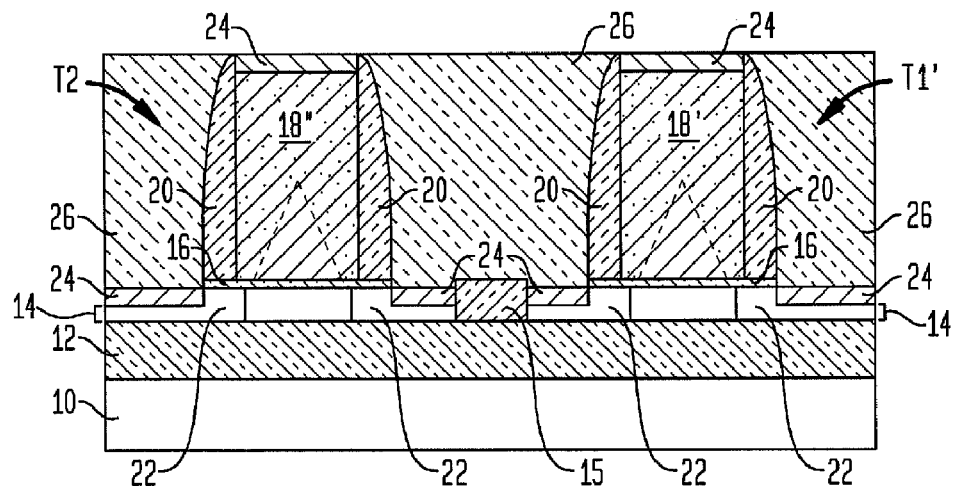

FIG. 6 shows the results of stripping the second mask 32 from the semiconductor structure of FIG. 5. The second mask 32 may be stripped using methods and materials analogous, equivalent or identical to the methods and materials used for stripping the first mask 28 from the semiconductor structure of FIG. 3 to provide the semiconductor structure of FIG. 4.

FIG. 6 shows a semiconductor structure in accordance with an embodiment of the invention. The semiconductor structure comprises a CMOS structure having a first transistor T1' and a second transistor T2' typically of differing conductivity types (i.e., different dopant polarities). The first transistor T1' and the second transistor T2' respectively include the first gate electrode 18' and the second gate electrode 18". Each of the first gate electrode 18' and the second gate electrode 18" has a laterally (i.e., a linewidth or a gate length) variable work function. The laterally variable work function within each of the gate electrodes 18' and 18" is effected using a large angle tilt implant method that uses an appropriate implanted work function modifying ion 30 or 34. As will be illustrated in further detail within the context of an example that follows, a lateral variation of a work function within a gate electrode within a transistor is particularly desirable for providing enhanced electrical properties of an undoped channel transistor fabricated using a particularly thin (i.e., from about 50 to about 100 angstroms) surface semiconductor layer within a semiconductor-on-insulator substrate.

Figure 7:
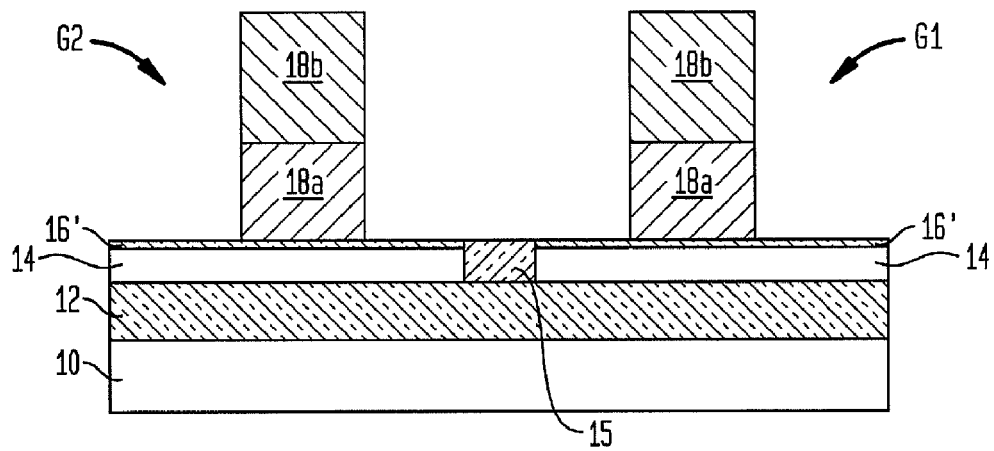
FIG. 7 to FIG. 17 show a series of schematic cross-sectional diagrams illustrating the results of progressive stages in fabricating a semiconductor structure in accordance with another embodiment of the invention.

FIG. 7 to FIG. 17 show a series of schematic cross-sectional diagrams illustrating the results of progressive stages in fabricating a semiconductor structure in accordance with another embodiment of the invention. This other embodiment comprises a second embodiment of the invention. FIG. 7 shows a schematic cross-sectional diagram of the semiconductor structure at an early stage in fabrication thereof in accordance with the second embodiment.

FIG. 7 shows the same base semiconductor substrate 10, buried dielectric layer 12, surface semiconductor layer 14 and isolation region 15 that are illustrated within the first embodiment that is illustrated within FIG. 1 to FIG. 6. The foregoing substrate, layers and structure may comprise materials, have thicknesses and be formed using methods analogous, equivalent or identical to those described above with respect to FIG. 1 to FIG. 6, and within the context of the first embodiment.

FIG. 7 also illustrates a plurality of gate dielectrics 16' that correspond with the gate dielectrics 16 within the first embodiment that is illustrated within FIG. 1 to FIG. 6, but which are larger in lateral dimension and completely cover the surface semiconductor layer 14.

FIG. 7 finally illustrates a plurality of gate electrode stacks G1 and G2, each one of which includes a mid-gap material layer 18a having a doped polysilicon material layer 18b (i.e., including a dopant concentration from about $10^{18}$ to about $10^{21}$ dopant atoms per cubic centimeter) located thereupon. Each of the gate electrode stacks G1 and G2 is intended to provide a moderate work function central region (i.e., having a work function from about 4.4 to about 4.8 electron-volts) to a laterally variable work function gate electrode that is fabricated incident to further processing of the semiconductor structure that is illustrated in FIG. 7. Mid-gap materials from which may be comprised the mid-gap material layers 18a include tungsten (W), titanium nitride (TiN) and tantalum nitride (TaN). Each of the mid-gap materials from which may be comprised the mid-gap material layers 18a and the doped polysilicon materials from which may be comprised the doped polysilicon material layers 18b may be formed using methods that are conventional in the semiconductor fabrication art. Non-limiting examples of methods include chemical vapor deposition methods, physical vapor deposition, and atomic-layer deposition (ALD) methods. Typically, each of the mid-gap material layers 18a has a thickness of about 50 to about 100 angstroms and each of the doped polysilicon layers 18b has a thickness from about 500 to about 1000 angstroms.

Figure 8:
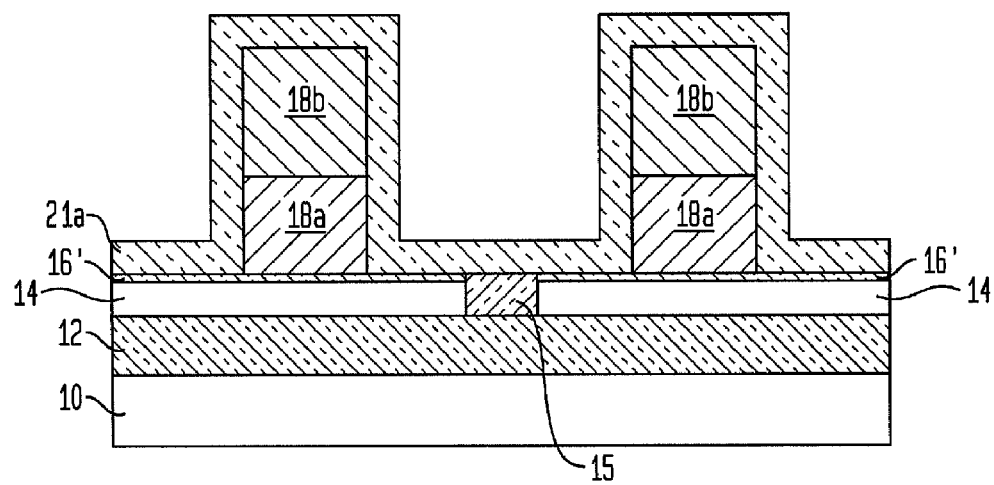
Figure 9:
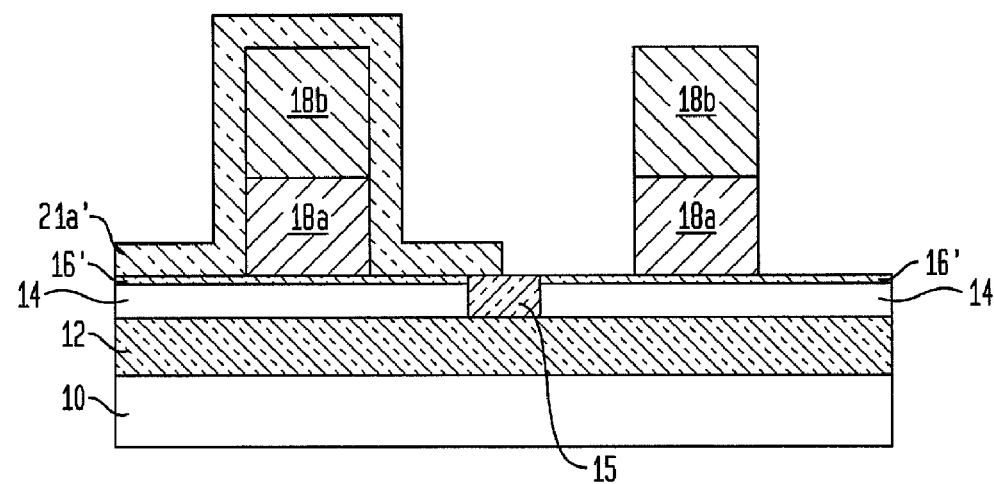

FIG. 8 shows a first capping layer 21a located conformally covering the semiconductor structure of FIG. 7. The first capping layer 21a may comprise any of several capping materials, although dielectric capping materials are particularly common. Typically, the first capping layer 21a comprises a silicon nitride capping material that has a thickness from about 200 to about 1000 angstroms. FIG. 9 shows the results of patterning the first capping layer 21a to form a first capping layer 21a' that covers the second gate electrode stack G2 but not the first gate electrode stack G1 as is illustrated in FIG. 7. The patterning may be effected using photolithographic and etch methods that are conventional in the semiconductor fabrication art. Etch methods in particular include wet chemical etch methods, dry plasma etch methods and aggregate etch methods thereof.

Figure 10:
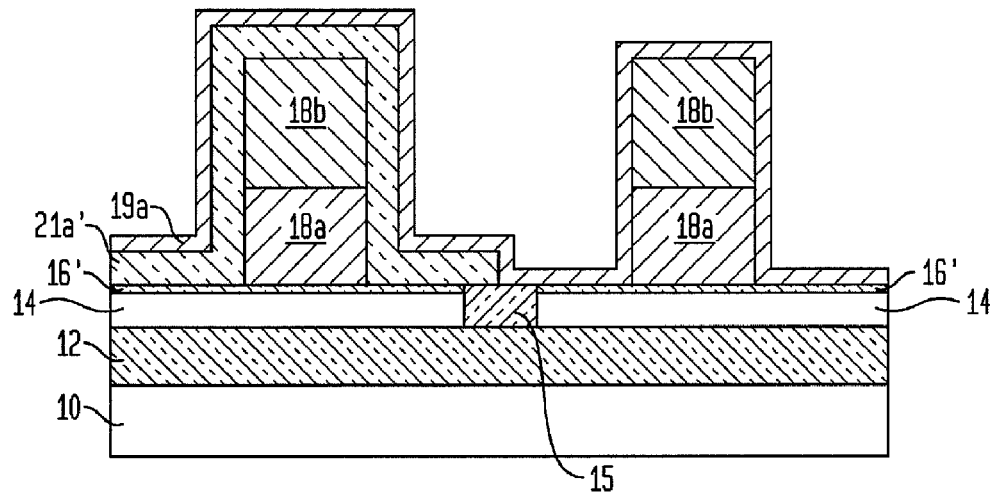

FIG. 10 shows a first work function modifying layer 19a located upon the semiconductor structure of FIG. 9. The first work function modifying layer 19a may comprise a material having a work function either lower than or greater than the work function of the gate electrode stacks G1 and G2. Lower work function materials may include, but are not limited to aluminum (Al), titanium (Ti), and tantalum (Ta) materials. Higher work function materials may include, but are not limited to nickel (Ni), platinum (Pt), and palladium (Pd) materials. Typically, the first work function modifying layer 19a comprises a lower work function material such as but not limited to aluminum (Al), titanium (Ti), and tantalum (Ta) that has a thickness from about 5 to about 25 angstroms.

Figure 11:
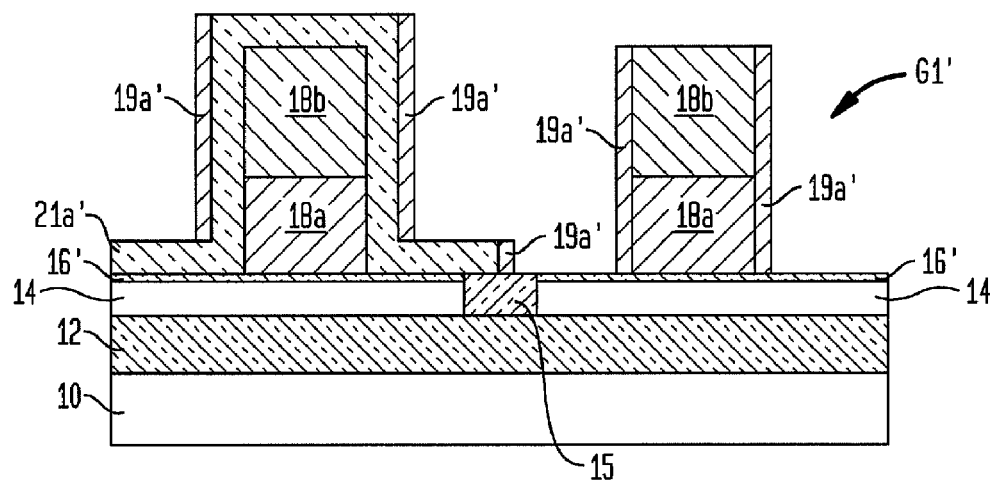
Figure 12:
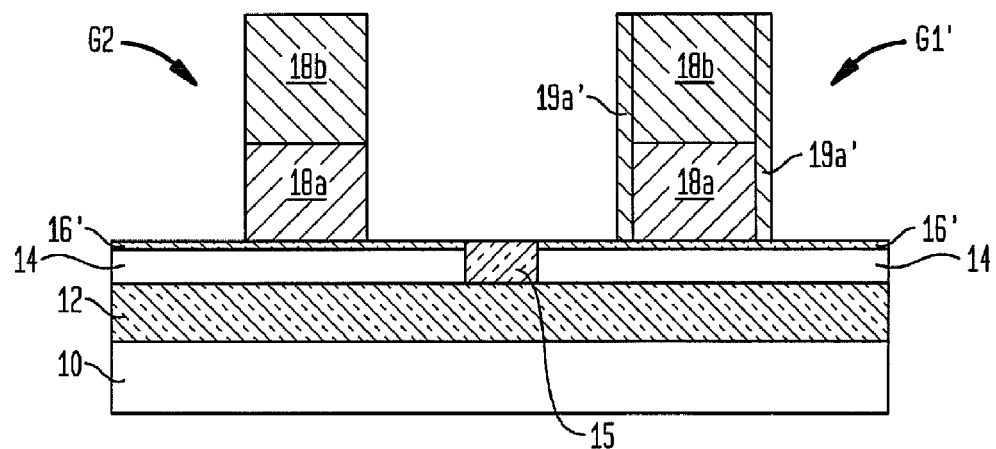

FIG. 11 shows the results of anisotropically etching the first work function modifying layer 19a to form a first work function modifying layer 19a'. The anisotropic etching uses an etchant gas composition appropriate to the material used to form the first work function modifying layer 19a. FIG. 12 shows the results of stripping the first capping layer 21a' and the first work function modifying layer 19a' from the second gate electrode stack G2, but not the first gate electrode stack G1, to thus provide a first gate electrode stack G1' from the first gate electrode stack G1. The foregoing stripping step is undertaken after masking the first gate electrode stack G1, typically with a photoresist layer formed using a conventional photolithographic method. Thus, the first gate electrode stack G1' has a laterally variable work function due to the presence of the first work function modifying layer 19a'.

FIG. 13 to FIG. 17 illustrate semiconductor structure fabrication process steps that correspond generally with the semiconductor structure fabrication process steps of FIG. 8 to FIG. 12.

Figure 13:
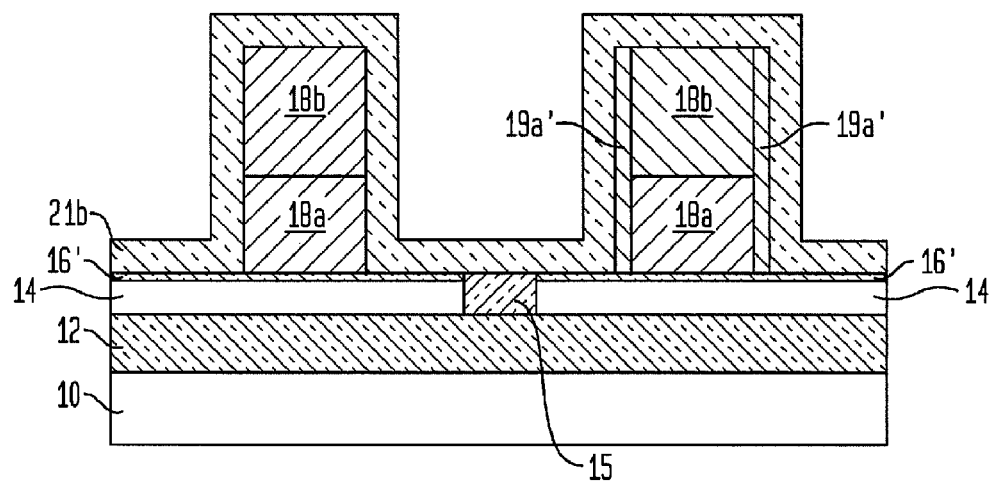
Figure 14:
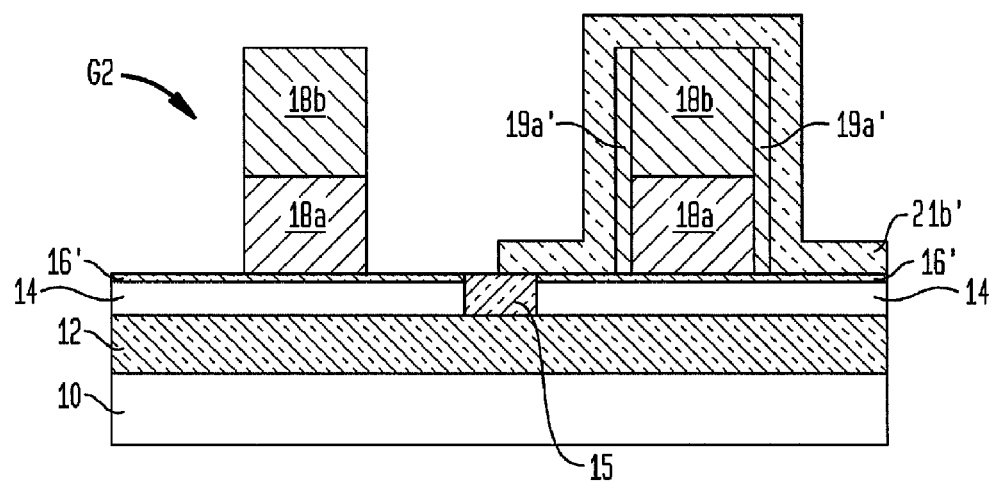

In particular, FIG. 13 shows a second capping layer 21b located upon the semiconductor structure of FIG. 12. The second capping layer 12b may comprise materials, have thickness dimensions and be formed using methods analogous, equivalent or identical to the materials, thickness dimensions and methods used for forming the first capping layer 21a that is illustrated in FIG. 8. FIG. 14 shows the results of patterning the first capping layer 21b to form a first capping layer 21b' that covers the first gate electrode stack G1' but not the second gate electrode stack G2.

Figure 15:
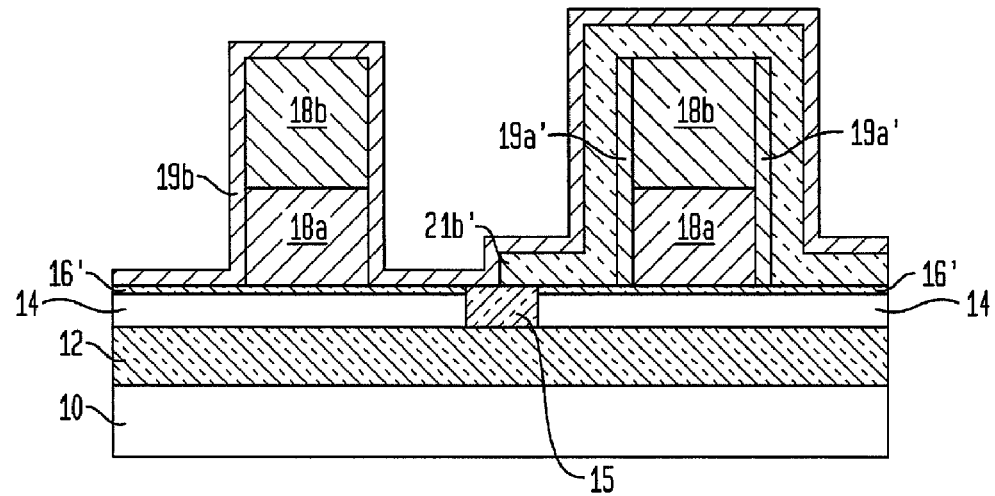

FIG. 15 shows the results of forming a second work function modifying layer 19b upon the semiconductor structure of FIG. 14. The second work function modifying layer 19b is otherwise generally analogous, equivalent or identical to the first work function modifying layer 19a that is illustrated in FIG. 10, but generally provides a reverse modification of the work function of the second gate electrode stack G2 in comparison with the first gate electrode stack G1'. Typically, the second work function modifying layer 19b comprises a higher work function material such as but not limited to nickel (Ni), platinum (Pt), and palladium (Pd) that has a thickness from about 5 to about 25 angstroms.

Figure 16:
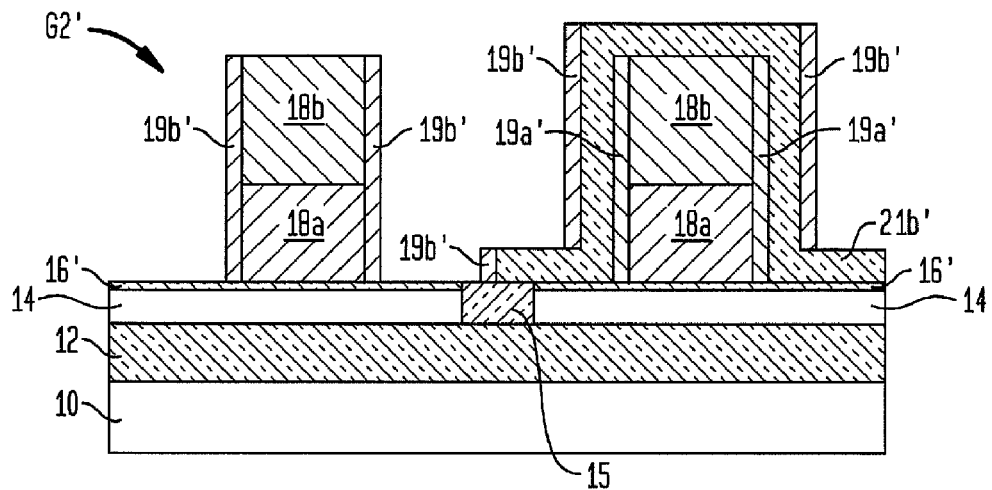
Figure 17:
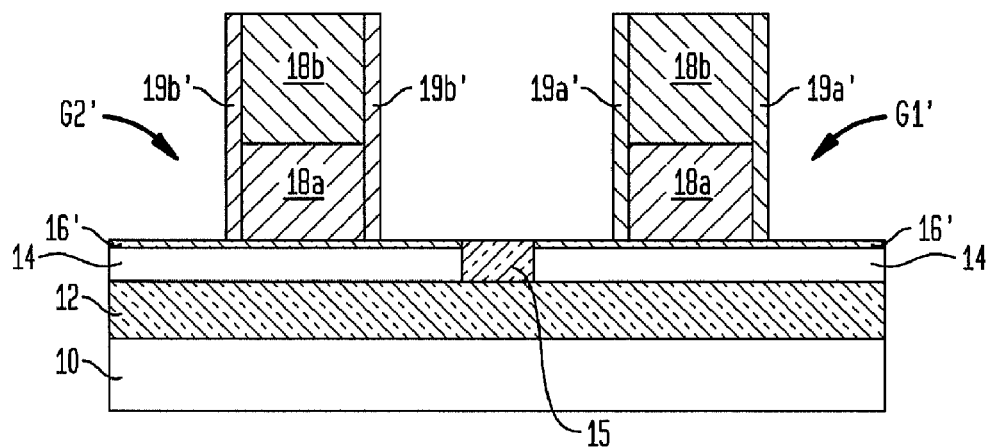

FIG. 16 shows the results of anisotropically etching the second work function modifying layer 19b to form a second work function modifying layer 19b'. Finally, FIG. 17 shows the results of stripping the second work function modifying layer 19b' and the second capping layer 21b' from the first gate electrode stack G1' to yield a pair of gate electrode stacks G1' and G2'. The second gate electrode stack G2' includes the second work function modifying layer 19b' and a first gate electrode stack G1' includes the first work function modifying layer 19a'. Further fabrication of the semiconductor structure of FIG. 17 may yield a CMOS semiconductor structure in accordance with the first embodiment.

FIG. 17 shows a semiconductor structure in accordance with a second embodiment of the invention. The semiconductor structure includes first and second gate electrode stacks G1' and G2'. The first gate electrode stack G1' includes a core comprising a mid-gap material layer 18a and a polysilicon layer 18b located thereupon. The first gate electrode stack G1' also includes the first work function modifying layer 19a' laminated to sidewalls of the mid-gap material layer 18a and the polysilicon layer 18b. The second gate electrode stack G2' also includes a core comprising a mid-gap material layer 18a and a polysilicon layer 18b located thereupon. The second gate electrode stack G2' also includes a second work function modifying layer 19b' laminated to the sidewalls of the mid-gap material layer 18a and the polysilicon layer 18b. Within the second embodiment, the first work function modifying layer 19a' and the second work function modifying layer 19b' utilize separate work function modifying materials that provide differing laterally variable work functions to the first gate electrode stack G1' and the second gate electrode stack G2'.

Figure 18:
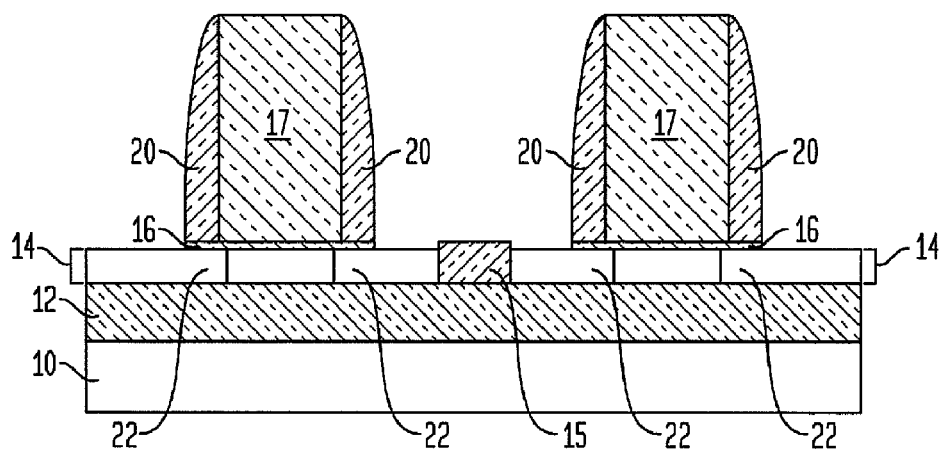
FIG. 18 to FIG. 28 show a series of schematic cross-sectional diagrams illustrating the results of progressive stages in fabricating a semiconductor structure in accordance with yet another embodiment of the invention.

FIG. 18 to FIG. 27 show a series of schematic cross-sectional diagrams illustrating the results of progressive stages in fabricating a semiconductor structure in accordance with yet another embodiment of the invention. This additional embodiment of the invention comprises a third embodiment of the invention. FIG. 18 shows a schematic cross-sectional diagram of a semiconductor structure at an early stage in the fabrication thereof in accordance with this third embodiment.

Figure 19:
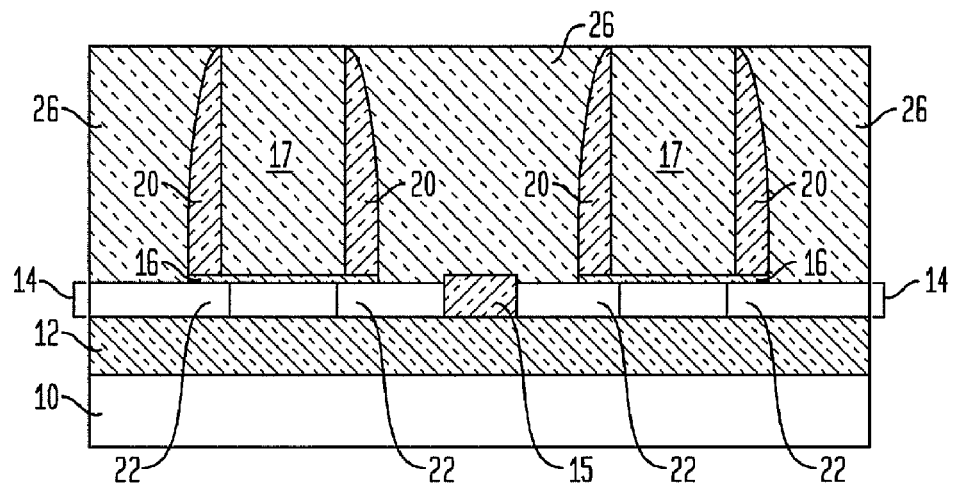

FIG. 18 and FIG. 19 correspond generally with FIG. 1 and FIG. 2 within the first embodiment, but absent the silicide layers 24 and with the presence of a plurality of sacrificial layers 17 in place of the plurality of gate electrodes 18. The sacrificial layers may 17 comprise any of several sacrificial materials. Non limiting examples include conductor sacrificial materials, semiconductor sacrificial materials and dielectric sacrificial materials. Typically, the sacrificial layers 17 comprise a polysilicon sacrificial material that provides appropriate etch selectivity to allow for further processing of the semiconductor structure of FIG. 19.

Figure 20:
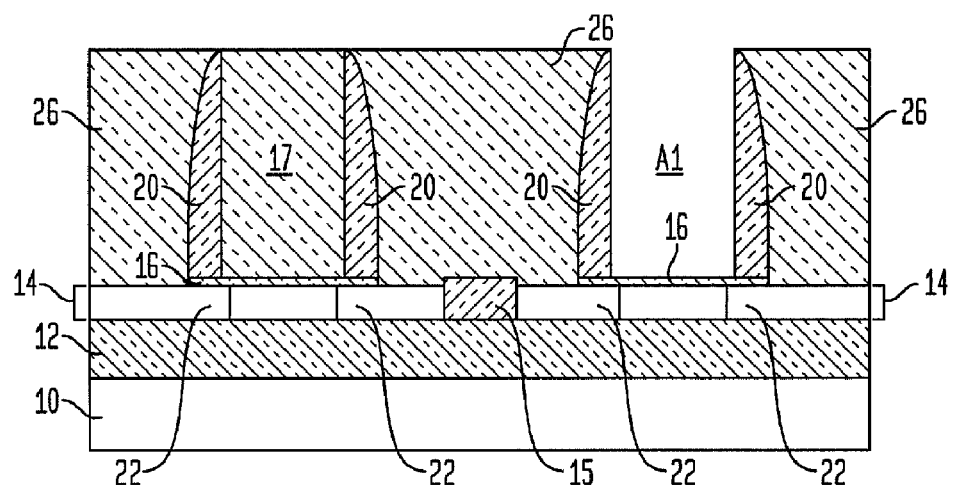

FIG. 20 shows the results of stripping the right hand sacrificial layer 17 to leave remaining an aperture A1. Although not specifically illustrated within FIG. 20, the left hand sacrificial layer 17 is typically masked (see, e.g., first mask layer 28 within FIG. 3) incident to stripping the right hand sacrificial layer 17. The right hand sacrificial layer 17 may be stripped using methods and materials that are conventional in the semiconductor fabrication art. Non limiting examples include wet chemical stripping methods, dry plasma stripping methods and aggregate stripping methods thereof. Typically, the right hand sacrificial layer 17 when comprised of a polysilicon material may be efficiently stripped using an appropriate aqueous acid solution, or alternatively a plasma etchant gas composition comprising a chlorine containing etchant gas. Additionally, and optionally, the gate dielectric 16 at the base of the aperture A1 may also be stripped and subsequently replaced with a different gate dielectric material.

Figure 21:
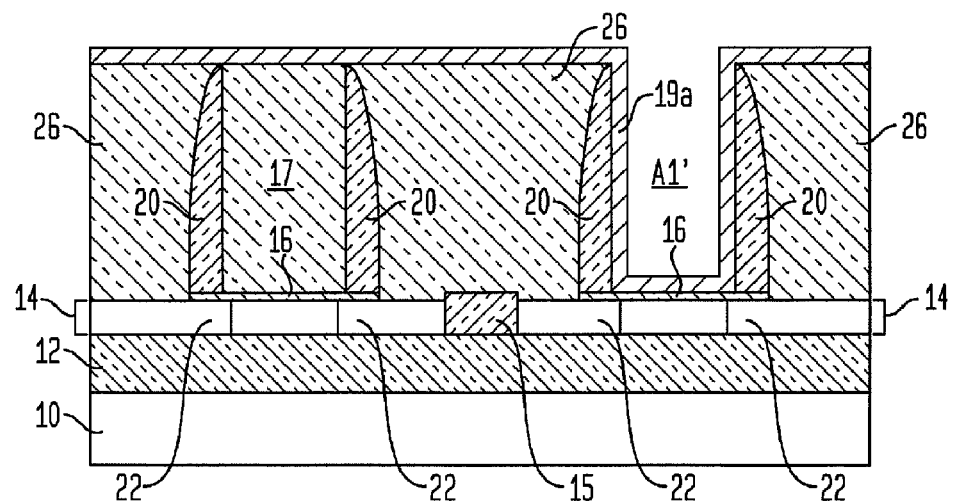

FIG. 21 shows a first work function modifying layer 19a located upon the semiconductor structure of FIG. 20 and partially filling the aperture A1 to form an aperture A1'. The first work function modifying layer 19a within FIG. 21 is analogous to the first work function modifying layer 19a within the second embodiment as illustrated in FIG. 10, but differs insofar as the first work function modifying layer 19a covers a differing topography within the second embodiment in comparison with the third embodiment.

Figure 22:
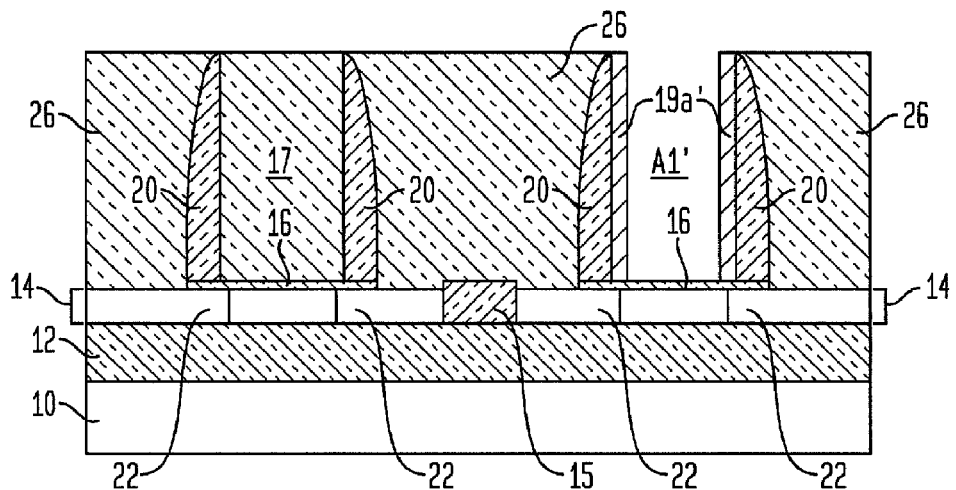

FIG. 22 shows the results of anisotropically etching the first work function modifying layer 19a to form a first work function modifying layer 19a' within the aperture A1'. The first work function modifying layer 19a may be anisotropically etched to form the first work function modifying layer 19a' while using anisotropic etch methods and materials that are conventional in the semiconductor fabrication art.

Figure 23:
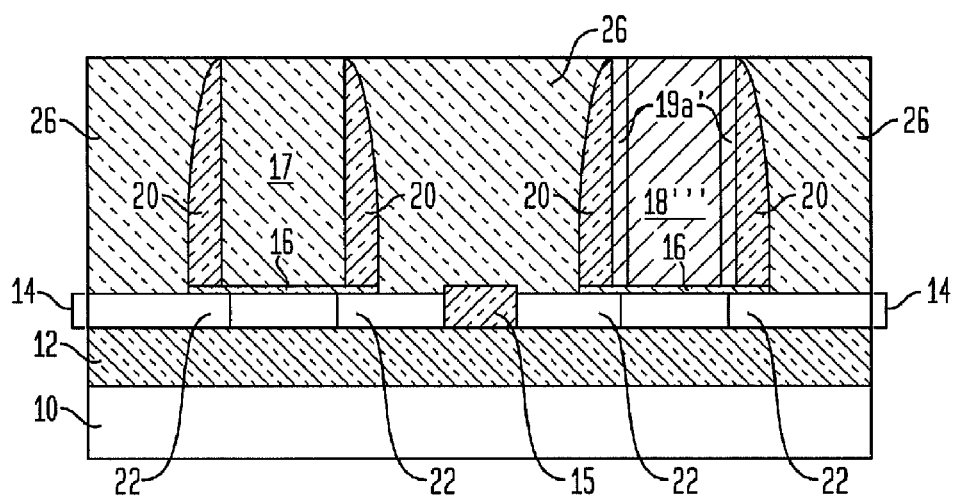

FIG. 23 shows the results of backfilling the aperture A1' with a gate electrode 18'''. The gate electrode 18''' may comprise materials and have dimensions analogous to the materials and dimensions used for forming the gate electrode 18 within the first embodiment as illustrated in FIG. 1. A method for forming the gate electrode 18''' is generally different since the gate electrode 18''' is usually formed using a blanket layer deposition and planarization method. Typically, the gate electrode 18''' comprises a mid-gap material (i.e., similar to mid-gap material layer 18a that is illustrated within the second embodiment within FIG. 7 to FIG. 7 to FIG. 17), such as but not limited to tungsten (W), titanium nitride (TiN) and tantalum nitride (TaN) that is planarized while using a chemical mechanical polish planarizing method.

Figure 24:
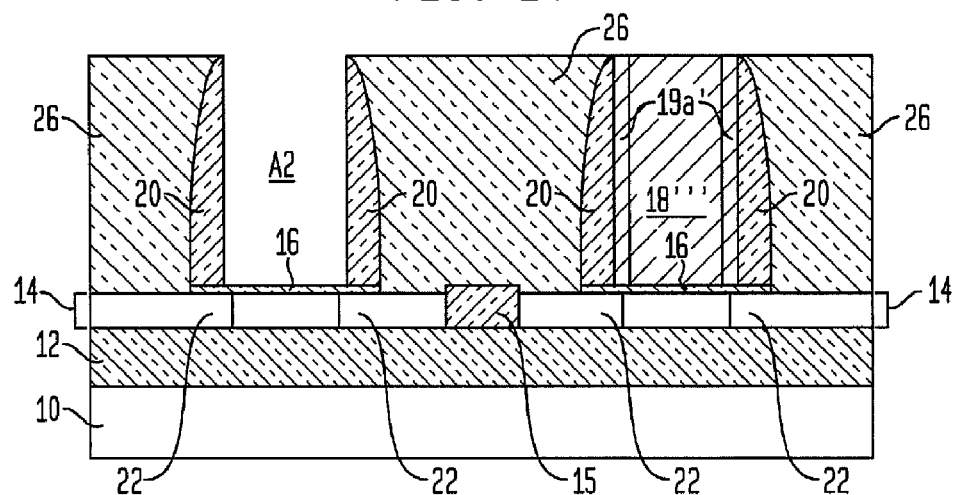
Figure 25:
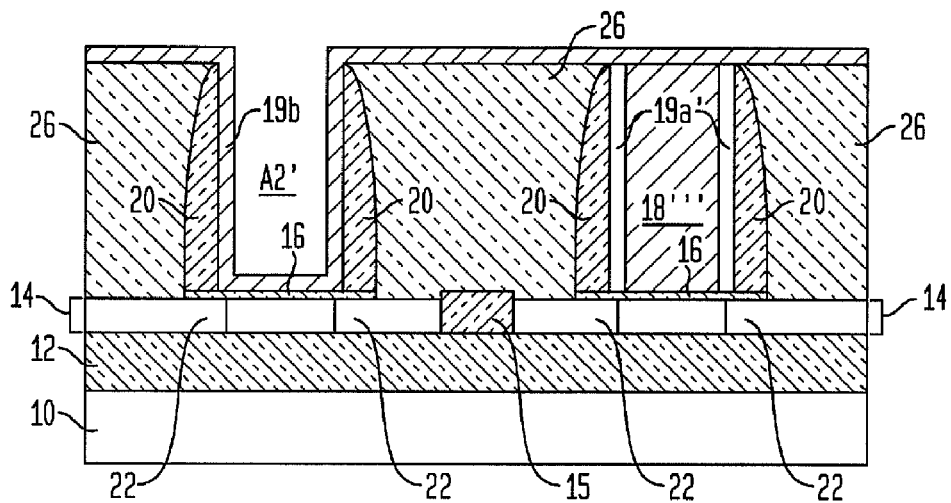
Figure 26:
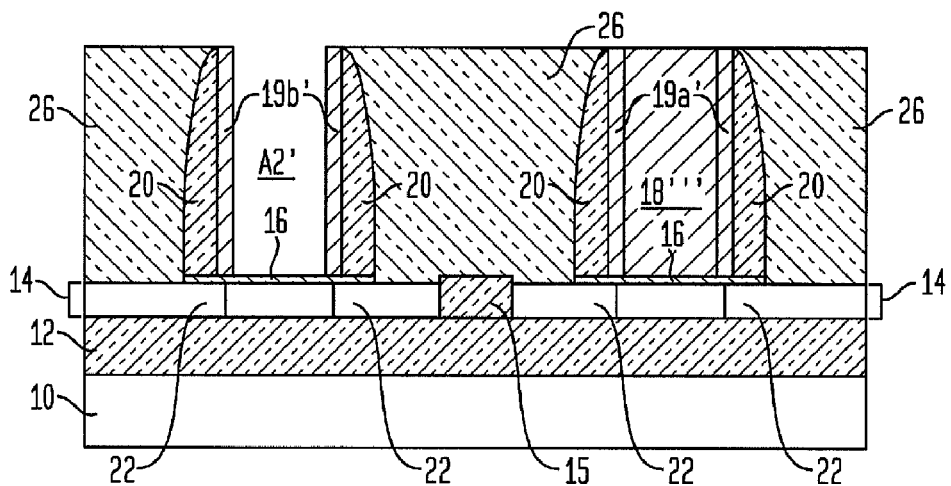
Figure 27:
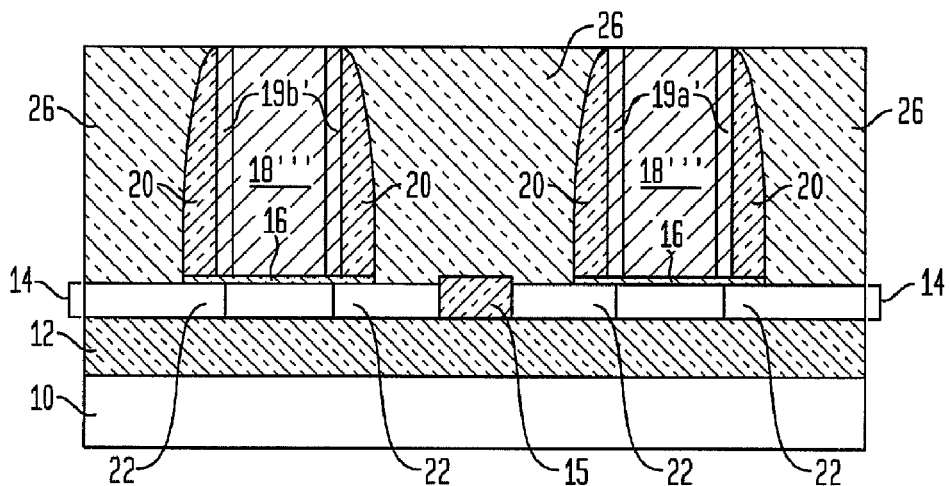

FIG. 24 to FIG. 27 illustrate the results of semiconductor structure fabrication similar to the semiconductor structure fabrication that is illustrated in FIG. 20 to FIG. 23. Specifically, FIG. 24 illustrates the results of stripping the left hand sacrificial layer 17 to form a second aperture A2 (analogously assuming masking of the gate electrode 18'''). FIG. 25 illustrates a second work function modifying layer 19b located upon the semiconductor structure of FIG. 24 and forming an aperture A2'. FIG. 26 shows the results of anisotropically etching the second work function modifying layer 19b to form a second work function modifying layer 19b' within the aperture A2'. Finally, FIG. 27 shows the results of backfilling the second aperture A2' with another gate electrode 18'''.

Figure 28:
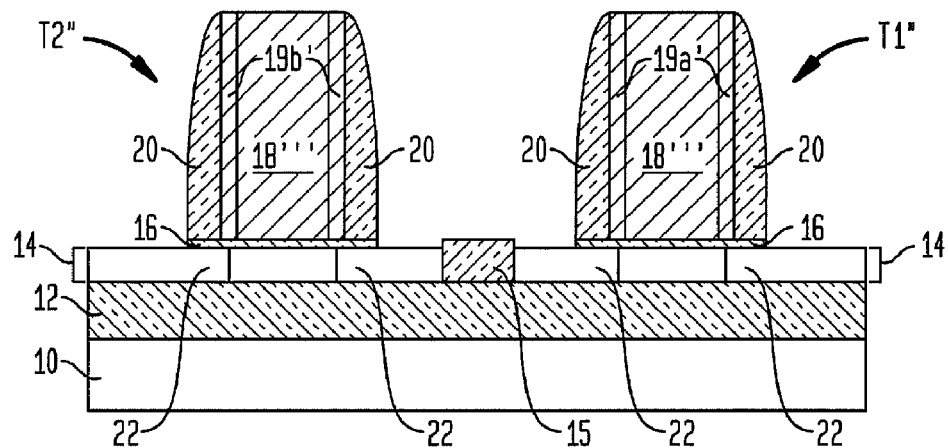

FIG. 28 shows the results of stripping the inter-level dielectric layer 26 from the semiconductor structure of FIG. 27. The stripping may be effected using methods and materials that are conventional in the semiconductor fabrication art. Such methods will typically include, but are not limited to wet chemical stripping methods and dry plasma stripping methods. The semiconductor structure of FIG. 28 may be further fabricated to provide silicide layers upon the gate electrodes 18''' and the source/drain regions 22 similar to the silicide layers 24 illustrated within the schematic cross-sectional diagrams of FIG. 1 to FIG. 6.

FIG. 27 and FIG. 28 show schematic cross-sectional diagrams of a semiconductor structure in accordance with a third embodiment of the invention. Similarly with the first embodiment, the third embodiment also provides a CMOS structure that includes a plurality of gate electrodes (i.e., comprising: (1) gate electrode 18''' and first work function modifying layer 19a' within a first transistor T1''; and (2) gate electrode 18''' and second work function modifying layer 19b' within a second transistor T2''), each of which has a laterally variable work function.

Figure 29:
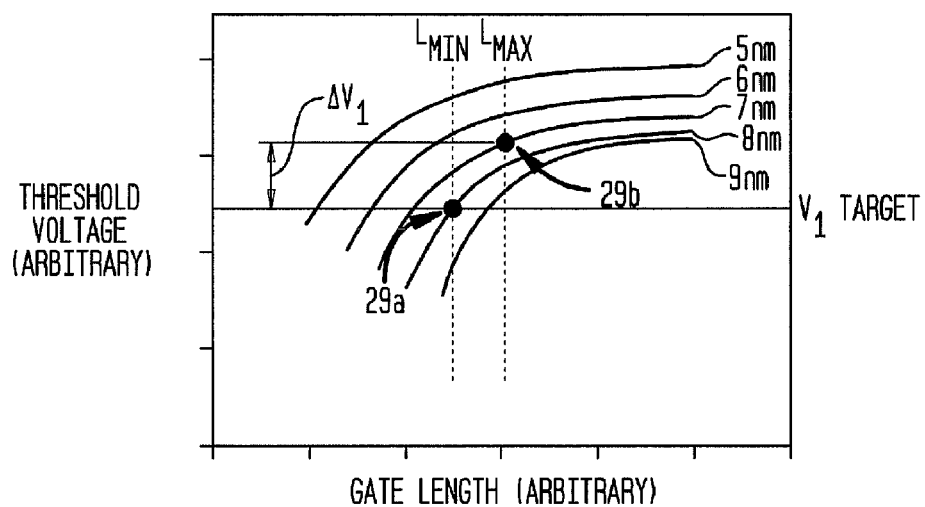
FIG. 29 and FIG. 30 show a pair of graphs illustrating Threshold Voltage versus Gate Length as a function of Surface Semiconductor Layer Thickness that illustrate the value of the invention.

FIG. 29 shows a graph of Threshold Voltage versus Gate Length (with arbitrary units for each axis) for a field effect transistor fabricated using a gate electrode without a laterally variable work function. FIG. 29 also shows a series of curves corresponding to the threshold voltages and gate lengths as a function of surface semiconductor layer thickness, in a surface semiconductor layer thickness range from 5 nm to 9 nm. As shown in FIG. 29, the roll-off characteristics are very sensitive to the surface semiconductor layer thickness. For thin surface semiconductor layers, threshold voltages remain constant at lower gate length values before "rolling-off", whereas for thicker surface semiconductor layers, the roll-off occurs at larger gate lengths. Due to quantum mechanical confinement in thin surface semiconductor layers, the threshold voltage value also increases for thinner surface semiconductor layers. Further illustrated in FIG. 29 is a reference point 29a for a threshold voltage at a minimum gate length for an 8 nm thick surface semiconductor layer. Finally illustrated within FIG. 29 is another reference point 29b for a threshold voltage at a nominal gate length for a 7 nm thick surface semiconductor layer. A difference between the foregoing two threshold voltages is designated as delta Vt.

Due to normal manufacturing variability in both gate length and semiconductor surface layer thickness within semiconductor-on-insulator substrates, an off current for a particular device needs to be specified for a worst case situation. Therefore, devices need to be designed such that they meet off-current specifications at some minimum gate length and at a worst-case surface semiconductor layer thickness value, as illustrated by reference point 29a. Therefore, a threshold voltage of a nominal device needs to be raised to much higher values than desirable, as shown by reference point 29b, in order to meet the off-current specification of the worst-case device. This delta Vt can dramatically degrade the performance of the overall technology.

Figure 30:
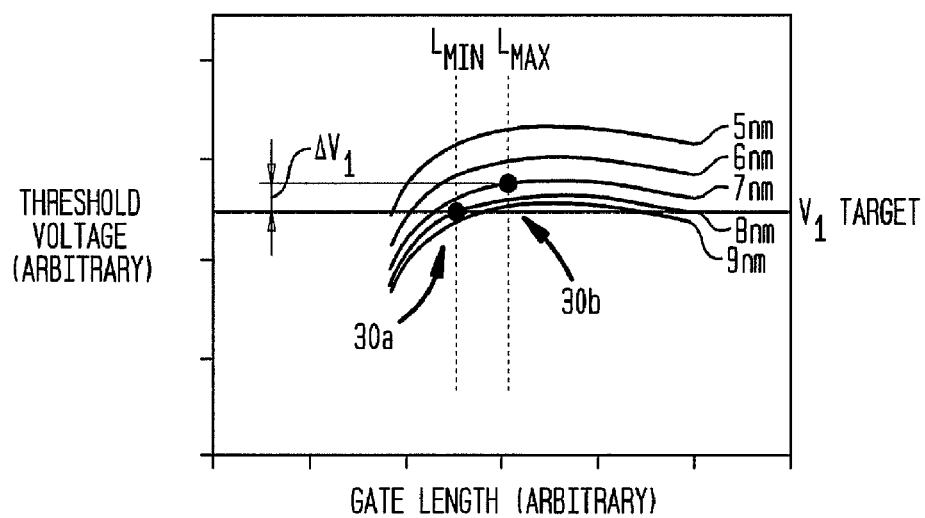

FIG. 30 shows a graph that corresponds with the graph of FIG. 29, but with the difference that the gate electrode comprises a core layer and laterally laminated outer layers such that the overall gate electrode has a laterally variable work function. Reference points 30a and 30b correspond with reference points 29a and 29b within FIG. 29. FIG. 30 also illustrates a considerably smaller delta Vt which is desirable since variations in surface semiconductor layer thickness will thus have a more limited effect on threshold voltage and provide for a greater manufacturing process window for fabricating CMOS devices and other field devices within undoped ultra thin semiconductor-on-insulator substrates. A smaller delta Vt also implies that the nominal devices represented by reference point 30b in FIG. 30 will have higher performance than the nominal devices shown as reference point 29b in FIG. 29.

The preferred embodiments of the invention are illustrative of the invention rather than limiting of the invention. Revisions and modifications may be made to methods, materials, structures and dimensions of semiconductor structures in accordance with the preferred embodiment while still providing an embodiment in accord with the invention further in accordance with the accompanying claims.

What is claimed is:

1. A semiconductor structure comprising:
a gate electrode located over a semiconductor substrate, the gate electrode having a laterally variable work function within the gate electrode,
wherein the gate electrode comprises an inverted V shaped core material having a first work function and a second material contiguous with the core material and having a second work function different than the first work function.

2. The semiconductor structure of claim 1 wherein the gate electrode is included within a MOSFET device.

3. The semiconductor structure of claim 1 wherein the gate electrode is included within a CMOS device.

4. The semiconductor structure of claim 1 wherein the gate electrode is included within a finFET device.

5. The semiconductor structure of claim 1 wherein the gate electrode comprises a comparatively higher work function central region.

6. The semiconductor structure of claim 1 wherein the gate electrode comprises a comparatively lower work function central region.

7. The semiconductor structure of claim 1 wherein the gate electrode comprises a core material having a first work function and a second material laminated to the core material and having a second work function different than the first work function.

8. The semiconductor structure of claim 1 wherein the gate electrode is located over an undoped channel within the semiconductor substrate.

* * * * *